United States Patent
Robinson

(10) Patent No.: US 7,488,992 B2
(45) Date of Patent: Feb. 10, 2009

(54) ELECTRONIC DEVICE COMPRISING ENHANCEMENT MODE PHEMT DEVICES, DEPLETION MODE PHEMT DEVICES, AND POWER PHEMT DEVICES ON A SINGLE SUBSTRATE AND METHOD OF CREATION

(75) Inventor: Kevin L. Robinson, Clay, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 771 days.

(21) Appl. No.: 10/727,387

(22) Filed: Dec. 4, 2003

(65) Prior Publication Data

US 2005/0124100 A1      Jun. 9, 2005

(51) Int. Cl.
- H01L 29/74      (2006.01)
- H01L 31/111     (2006.01)
- H01L 31/0328    (2006.01)
- H01L 31/0336    (2006.01)
- H01L 31/072     (2006.01)

(52) U.S. Cl. .............. 257/130; 257/133; 257/136; 257/194

(58) Field of Classification Search .......... 438/167; 257/130, 133, 136, 139, 159, 183, 194, 264, 257/268, 402, 348, 504, 392, 393

See application file for complete search history.

(56) References Cited

U.S. PATENT DOCUMENTS

| | | | |
|---|---|---|---|
| 5,030,852 A * | 7/1991 | Higashisaka | 326/33 |
| 5,270,228 A | 12/1993 | Ishikawa | |
| 5,339,083 A | 8/1994 | Inami | |
| 5,364,816 A | 11/1994 | Boos et al. | |
| 5,705,940 A * | 1/1998 | Newman et al. | 326/68 |
| 6,242,293 B1 | 6/2001 | Danzilio | |
| 6,248,666 B1 | 6/2001 | Frijlink et al. | |
| 6,271,547 B1 | 8/2001 | Hoke et al. | |
| 6,274,893 B1 * | 8/2001 | Igarashi et al. | 257/192 |
| 6,294,801 B1 * | 9/2001 | Inokuchi et al. | 257/192 |
| 6,307,221 B1 | 10/2001 | Danzilio | |
| 6,542,037 B2 | 4/2003 | Noll et al. | |
| 6,573,129 B2 | 6/2003 | Hoke et al. | |
| 6,593,603 B1 * | 7/2003 | Kim et al. | 257/194 |
| 6,620,662 B2 | 9/2003 | Hoke et al. | |
| 6,703,638 B2 | 3/2004 | Danzilio | |

(Continued)

FOREIGN PATENT DOCUMENTS

NL       EP 03102255.1    *   7/2003

*Primary Examiner*—Chuong A. Luu
(74) *Attorney, Agent, or Firm*—Howard IP Law Group, PC

(57) ABSTRACT

The present invention comprises an integrated circuit fabricated on a single substrate where the integrated circuit comprises a first block comprising an enhancement mode pHEMT transistor on a substrate; a second block comprising a depletion mode pHEMT transistor on the substrate, the second block operatively connected to the first block; and a third block comprising a power pHEMT transistor on the substrate, the third block operatively connected to at least one of the first block and the second block. It is emphasized that this abstract is provided to comply with the rules requiring an abstract which will allow a searcher or other reader to quickly ascertain the subject matter of the technical disclosure. It is submitted with the understanding that it will not be used to interpret or limit the scope of meaning of the claims.

19 Claims, 11 Drawing Sheets

U.S. PATENT DOCUMENTS

| | | | |
|---|---|---|---|
| 6,787,826 B1 * | 9/2004 | Tserng et al. ............... 257/280 |
| 6,797,994 B1 | 9/2004 | Hoke et al. |
| 6,853,014 B2 * | 2/2005 | Taylor et al. ................ 257/183 |
| 6,870,207 B2 * | 3/2005 | Taylor ........................ 257/217 |
| 2002/0171076 A1 | 11/2002 | Danzilio |
| 2002/0177261 A1 * | 11/2002 | Song ........................... 438/167 |
| 2006/0208279 A1 * | 9/2006 | Robinson et al. ............. 257/194 |

* cited by examiner

| | VP (v) | Fmax (GHz) | BVgd (v) | Ids (mA/mm) | Gmax (mS/mm) | Imax (mA/mm) |
|---|---|---|---|---|---|---|
| Power | −1.0 ±0.050 | >100 | >12 | 450 | >350 | >500 |
| D-mode | −1.0 ±0.050 | >100 | >6 | 450 | >450 | >500 |
| E-mode | +0.1 ±0.050 | >100 | >6 | 160 | >500 | >400 |

| | Ft (GHz) | Fmax (GHz) | NF (dB) | Rds (ohm–mm) | Gm (mS/mm) |
|---|---|---|---|---|---|
| Power | >30 | >100 | N/A | >28 | >300 |
| D-mode | >50 | >100 | <0.8 | >28 | >400 |
| E-mode | >50 | >100 | <0.8 | >28 | >450 |

FIG. 1b

ELECTRONIC DEVICE COMPRISING ENHANCEMENT MODE PHEMT DEVICES, DEPLETION MODE PHEMT DEVICES, AND POWER PHEMT DEVICES ON A SINGLE SUBSTRATE AND METHOD OF CREATION

FIELD OF THE INVENTION

The present invention relates to integrated circuits, especially those capable of operating at high frequencies.

BACKGROUND OF THE INVENTION

Numerous integrated circuits have been proposed and fabricated over the years. As devices gain faster clock speeds, a need has arisen for integrated circuits that possess the ability to function at high clock speeds with appropriate power consumption and power generation.

Some circuits, e.g. analog/digital converters, typically operate at lower frequencies as the typical method of constructing such circuits involves using printed wiring boards which can limit the functional processing speed, lower frequency integrated circuits, or a combination thereof. These circuits typically have additional cost due to the cost of housing the separate components.

Over the years, specialized devices have been developed which lend themselves to a certain class or range of operation. Pseudomorphic high electron mobility transistor (pHEMT) devices are currently used for microwave and millimeter wave integrated circuit devices (MMIC) having extremely high performance. Frequencies typically range from X-band (8 GHz) to W-band (110 GHz) for such MMIC devices.

At least three different pHEMT devices are currently fabricated: enhancement mode pHEMT, depletion mode pHEMT, and power pHEMT.

SUMMARY

The present invention comprises an integrated circuit fabricated on a single substrate where the integrated circuit comprises devices comprising enhancement mode pHEMT, depletion mode pHEMT, and power pHEMT blocks, fabricated in a single process, wherein predetermined portions of the blocks may be interconnected to form a functional, operational electronic device.

The scope of protection is not limited by the summary of an exemplary embodiment set out above, but is only limited by the claims.

BRIEF DESCRIPTION OF THE DRAWINGS

FIG. 1b is a set of tables indicating typical values for enhancement mode, depletion mode and power pHEMT devices;

DETAILED DESCRIPTION OF THE PREFERRED EMBODIMENT

Figure 1:
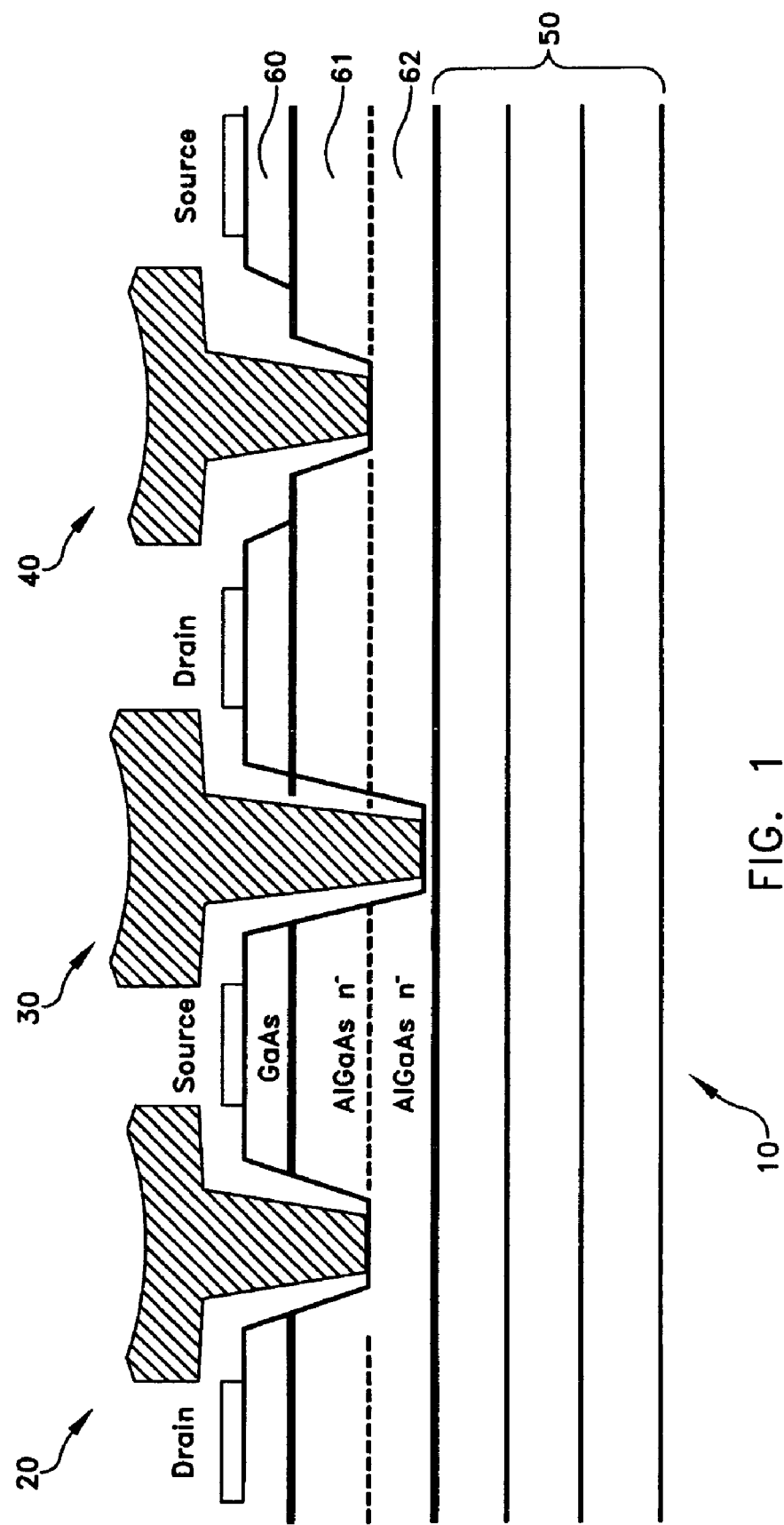
FIG. 1 is a schematic of an exemplary system.

Referring now to FIG. 1, electronic device 10 comprises enhancement mode pHEMT 20, depletion mode pHEMT 30, and power pHEMT 40 fabricated onto a single substrate, e.g. 50.

Figure 1A:
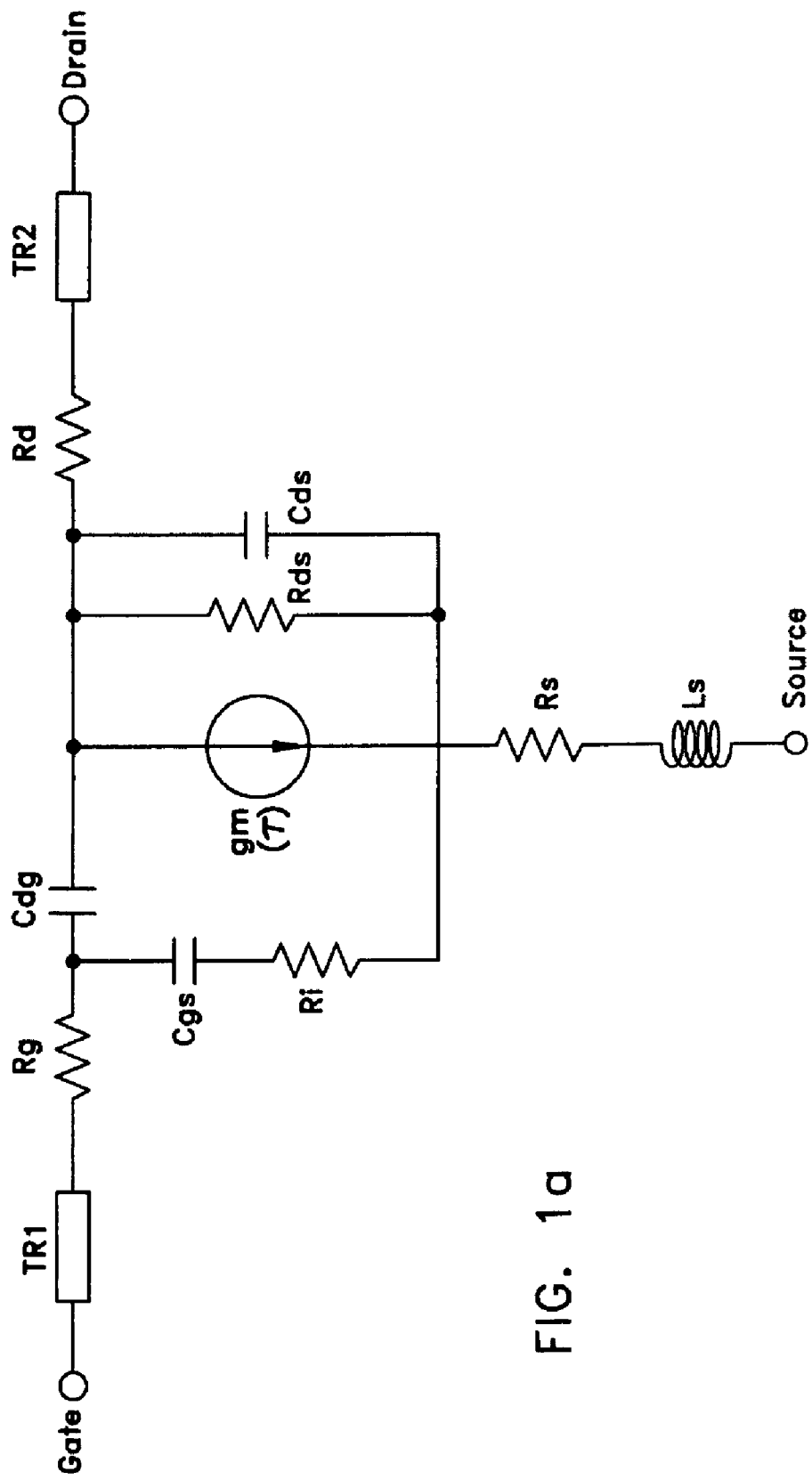
FIG. 1a is an exemplary depletion mode circuit.

Depletion mode pHEMT 30 may be single or multiple recess pHEMT 30. A typical circuit element using depletion mode pHEMT 30 is shown in FIG. 1a.

Typical values for enhancement mode 20, depletion mode 30 and power pHEMT 40 are shown in FIG. 1b.

Substrate 50 may be singly- or multi-layered and may comprise combinations of group III-V elements, e.g. GaAs, AlGaAs, InGaAs, InGaP, AlAs, and the like, or combinations thereof. In a preferred mode, substrate 50 comprises gallium arsenide.

Figure 2:
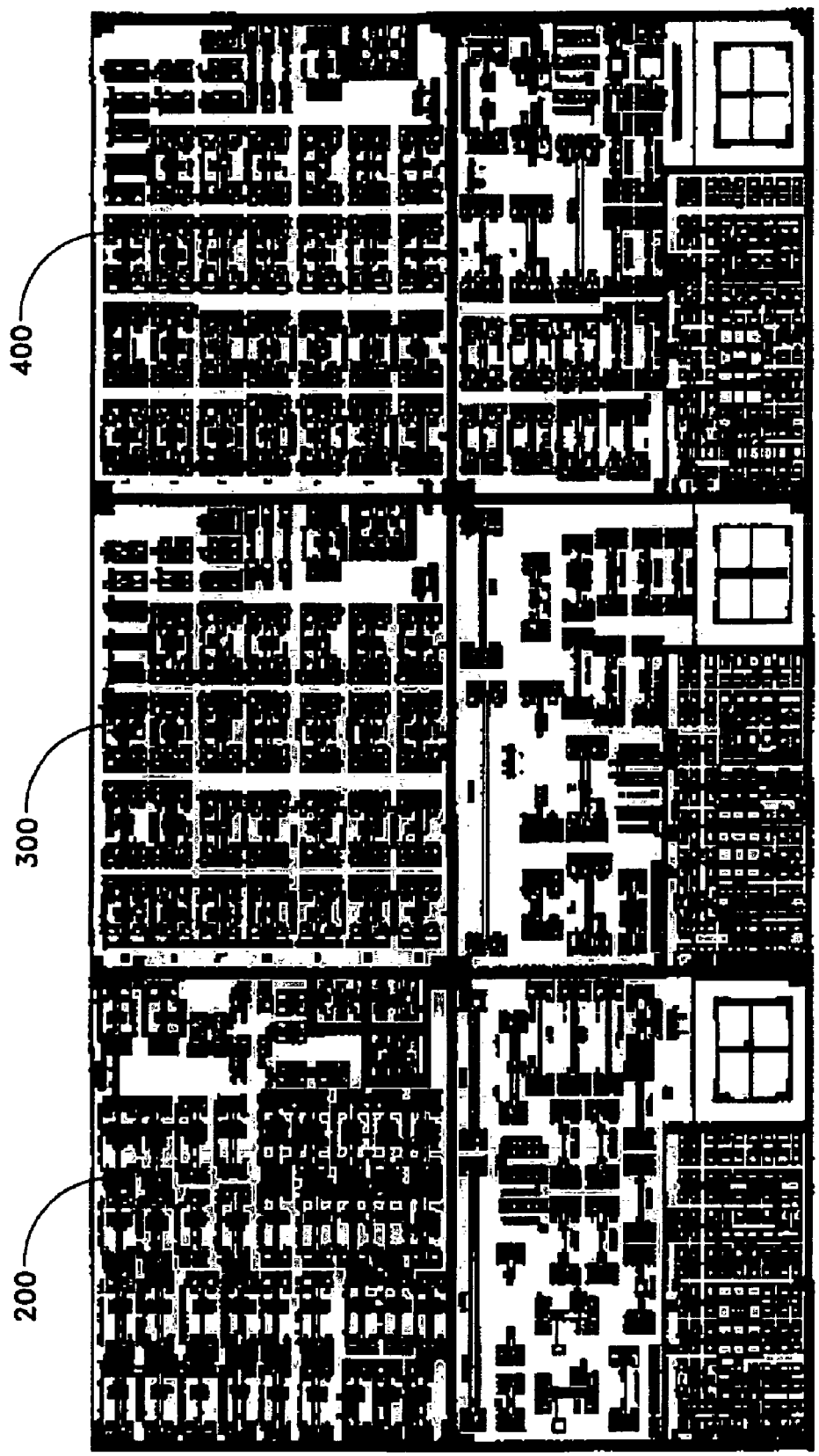
FIG. 2 is an exemplary device comprising functional blocks.

Referring now to FIG. 2, an operational integrated circuit may be fabricated which contains a plurality of functional blocks 110,200,300,400 to form a useful, operational electronic device. Functional blocks, generally referred to by 200, 300, and 400, may comprise enhancement mode pHEMT blocks 200 comprising enhancement mode pHEMT 20 (shown in an exemplary layout in FIG. 3), depletion mode pHEMT blocks 300 comprising depletion mode pHEMT 30 (shown in an exemplary layout in FIG. 4), power pHEMT blocks 400 comprising power pHEMT 40. Other circuit blocks may be present as well, e.g. blocks 100. A plurality of blocks, e.g. integrated circuits, may therefore be present on a single substrate 50 (FIG. 1), at least one of the plurality of blocks 100,200,300,400 comprising enhancement mode-pHEMT 20, a further one of the plurality of blocks comprising depletion mode pHEMT 30, and yet a further one of the plurality of blocks comprising power pHEMT 40. Blocks 100,200,300,400 may be operatively interconnected, e.g. one or more devices and/or circuits in enhancement mode pHEMT block 200 may be operatively interconnected to one or more devices and/or circuits in depletion mode pHEMT block 300 and/or one or more devices and/or circuits in power pHEMT block 400 such as with conductive traces.

Functional blocks 200,300,400 may themselves comprise higher level functional logic, e.g. may comprise digital gates, serial shift registers, serial to parallel converters, parallel to serial converters, level shift registers, variable gain radio frequency (RF) amplifiers, variable RF phase shifters, variable RF attenuators, resistors, inductors, capacitors, and the like, or combinations thereof.

Figure 2A:
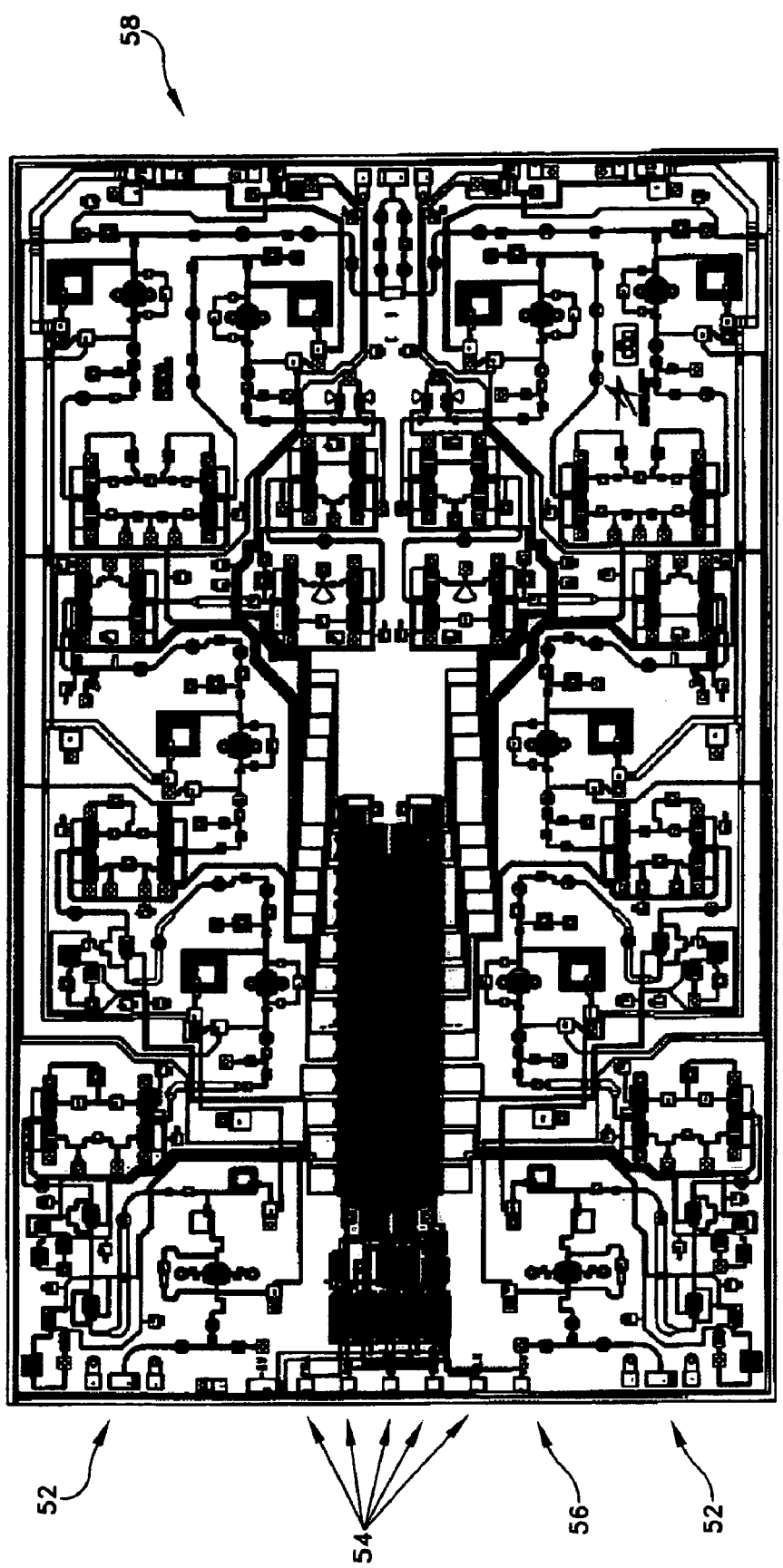
FIG. 2a is an exemplary device comprising functional blocks and showing various exemplary inputs and outputs.

For example, referring additionally to FIG. 2a, analog inputs 52 may be fabricated and interconnected with at least one of enhancement mode pHEMT block 200, depletion mode pHEMT block 300, power pHEMT block 400, circuit block 110, or a combination thereof. Circuit block 110 may further comprise clock input 56 in communication with at least one of enhancement mode pHEMT block 200, depletion mode pHEMT block 300, power pHEMT block 400, or a combination thereof. Digital input 54 may be further fabricated to be in communication with at least one of enhancement mode pHEMT block 200, depletion mode pHEMT block 300, power pHEMT block 400, or a combination thereof. One or more outputs of the functional circuitry may be fabricated as well, e.g. radio frequency output 58.

Referring back to FIG. 2, when fabricated, functional blocks 110,200,300,400 may then be interconnected to form an active or passive electronic device, e.g. an analog to digital converter or a microwave and millimeter wave integrated circuit (MMIC). Devices fabricated according to the present invention comprise an operational circuit, i.e. active or passive electronic devices, capable of operating at a frequency within the range of from very low frequency up to and including X-band frequencies.

Figure 3:
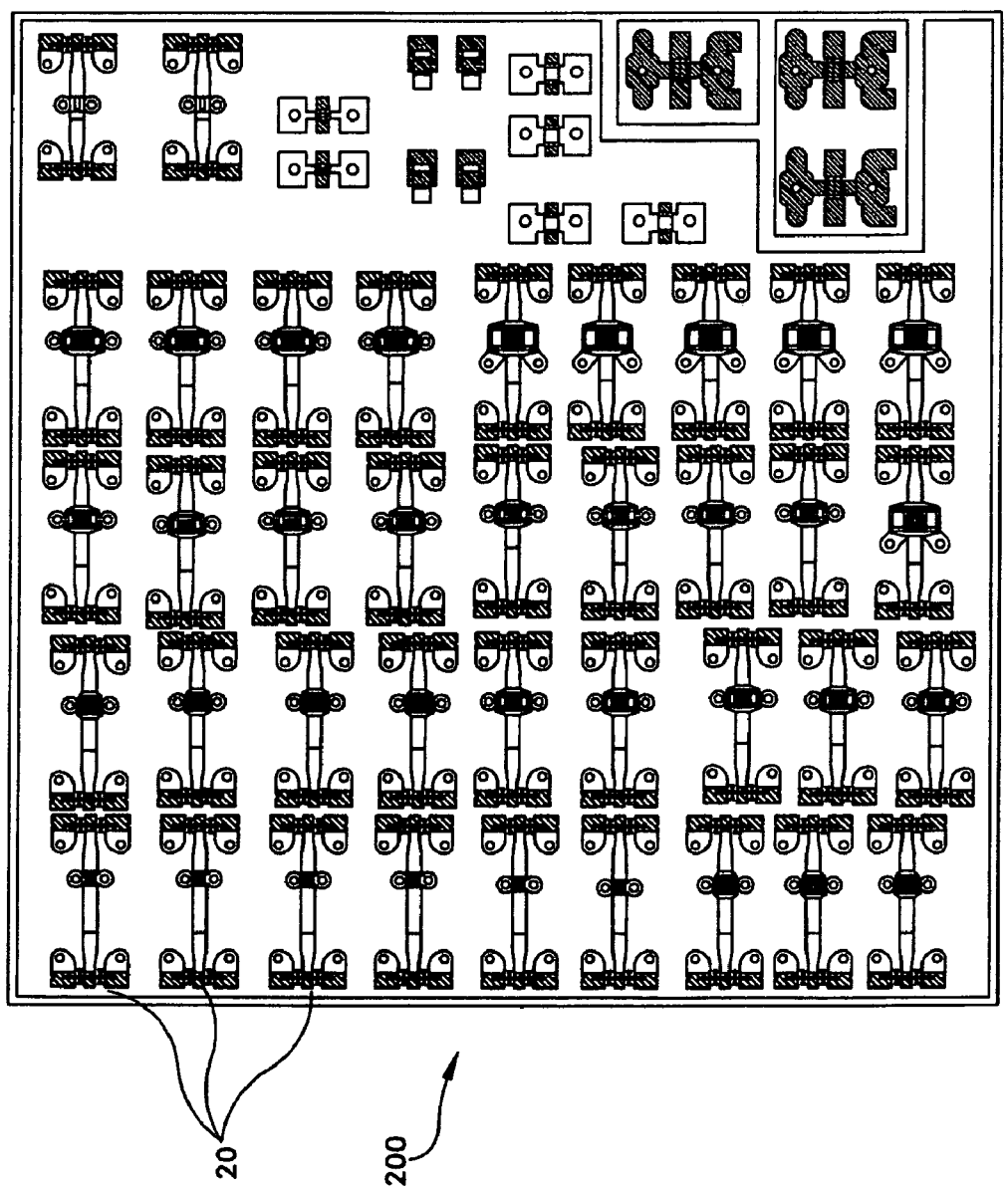
FIG. 3 is an exemplary enhancement mode pHEMT device.
Figure 4:
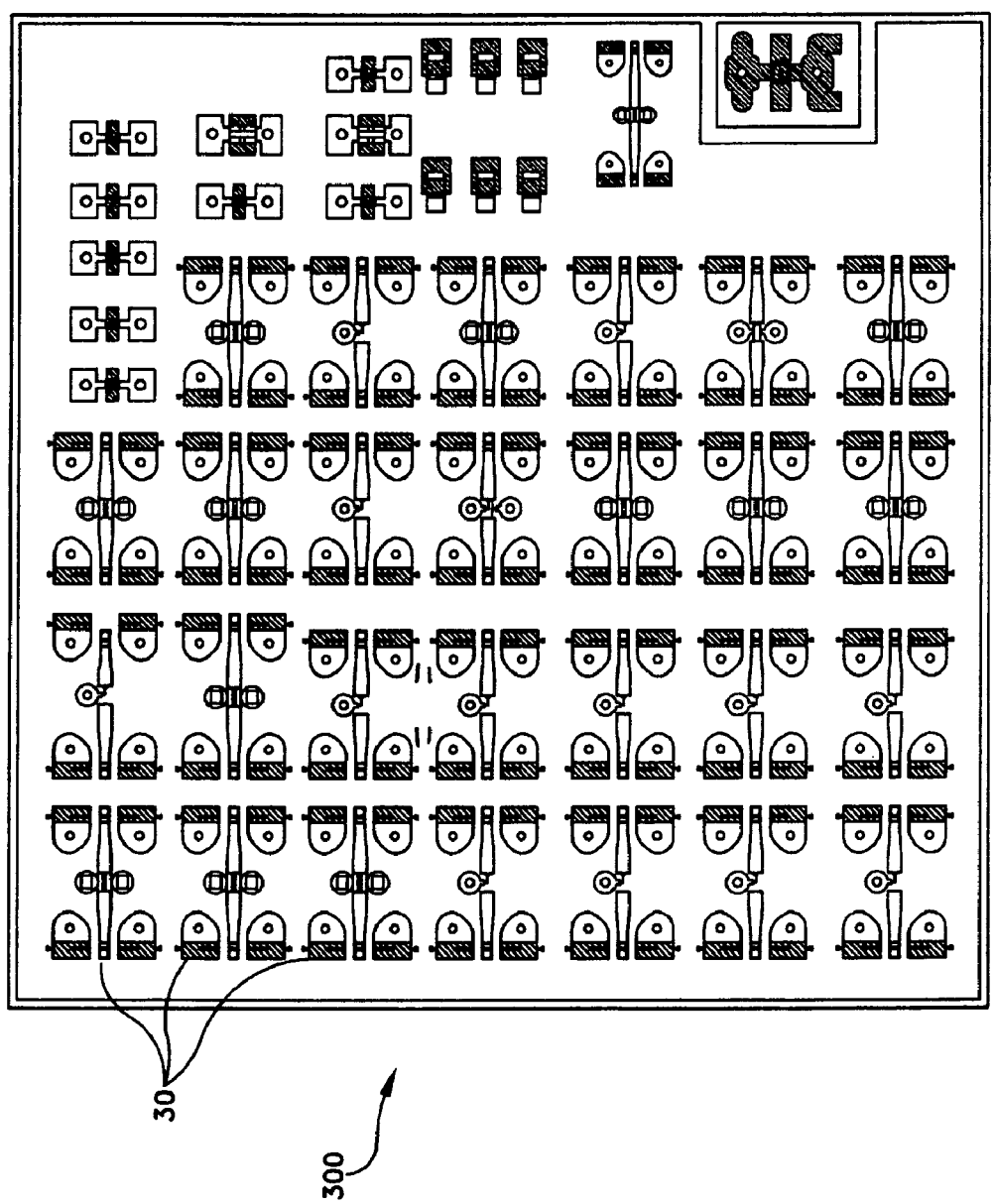
FIG. 4 is an exemplary depletion or power mode pHEMT device.

Referring additionally to FIG. 3 and FIG. 4, each functional block 200,300,400 may comprise one or more active devices, e.g. as shown in FIG. 3 enhancement mode pHEMT block 200 may comprise a plurality of enhancement mode pHEMT devices 20. As shown in FIG. 4, depletion mode pHEMT block 300 may comprise a plurality of depletion mode pHEMT devices 30. In a preferred embodiment, power mode pHEMT block 400 may be laid out similarly to depletion mode pHEMT block 300.

Figure 7:
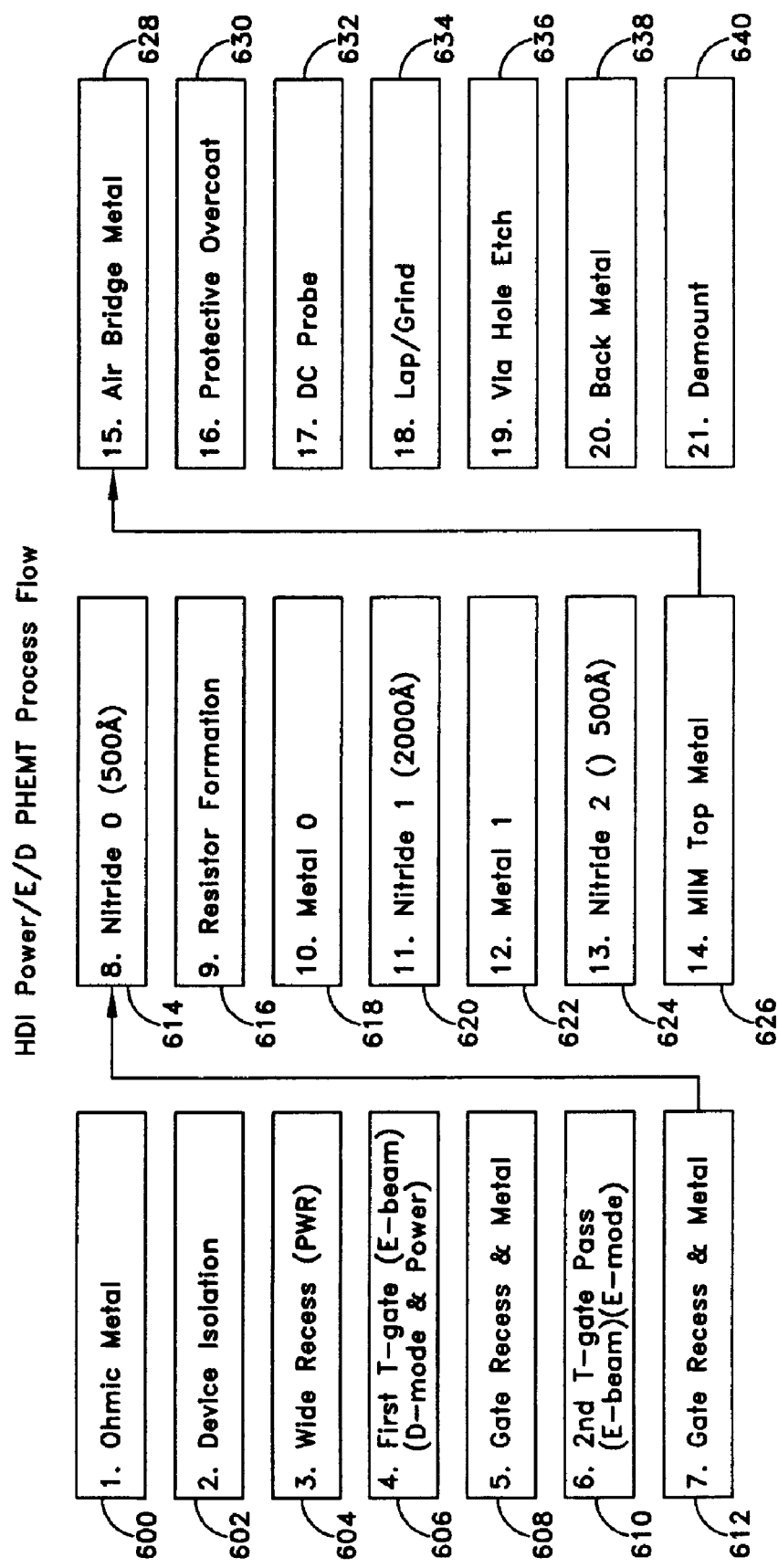
FIG. 7 is a flowchart of an exemplary fabrication process.

Additional elements consisting of resistors, capacitors and inductors may be included in all blocks. Referring additionally to FIG. 7, resistor, capacitor and inductor contacts may be formed, at step 618. A nitride layer may be formed, step 620, to form a capacitor dielectric as well as an inductor spacer. A top contact may be formed, at step 622 Metal 1. Resistors may be formed, e.g. at step 616.

Figure 5A:
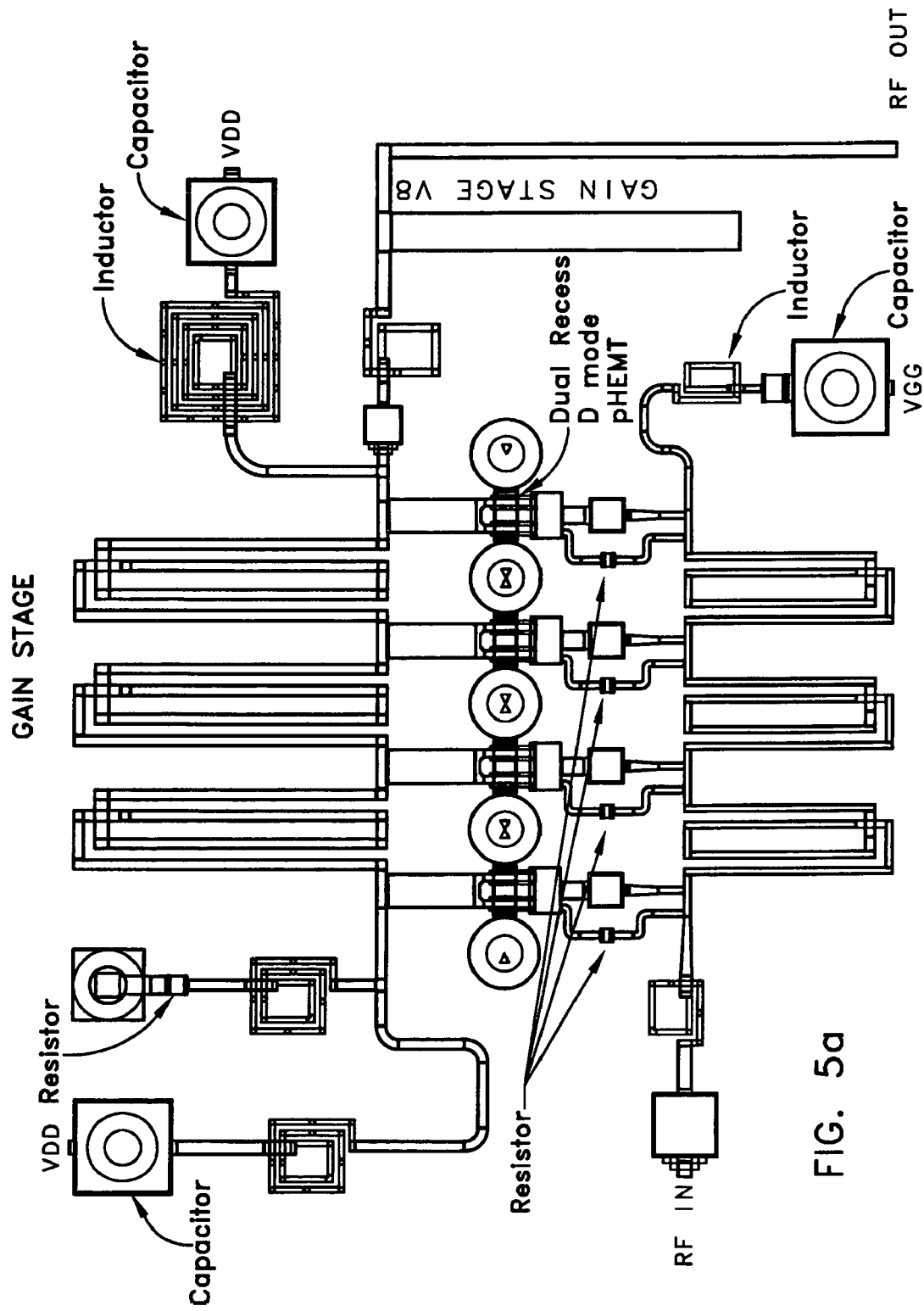
FIG. 5a is an exemplary gain stage of an exemplary pHEMT device.
Figure 5B:
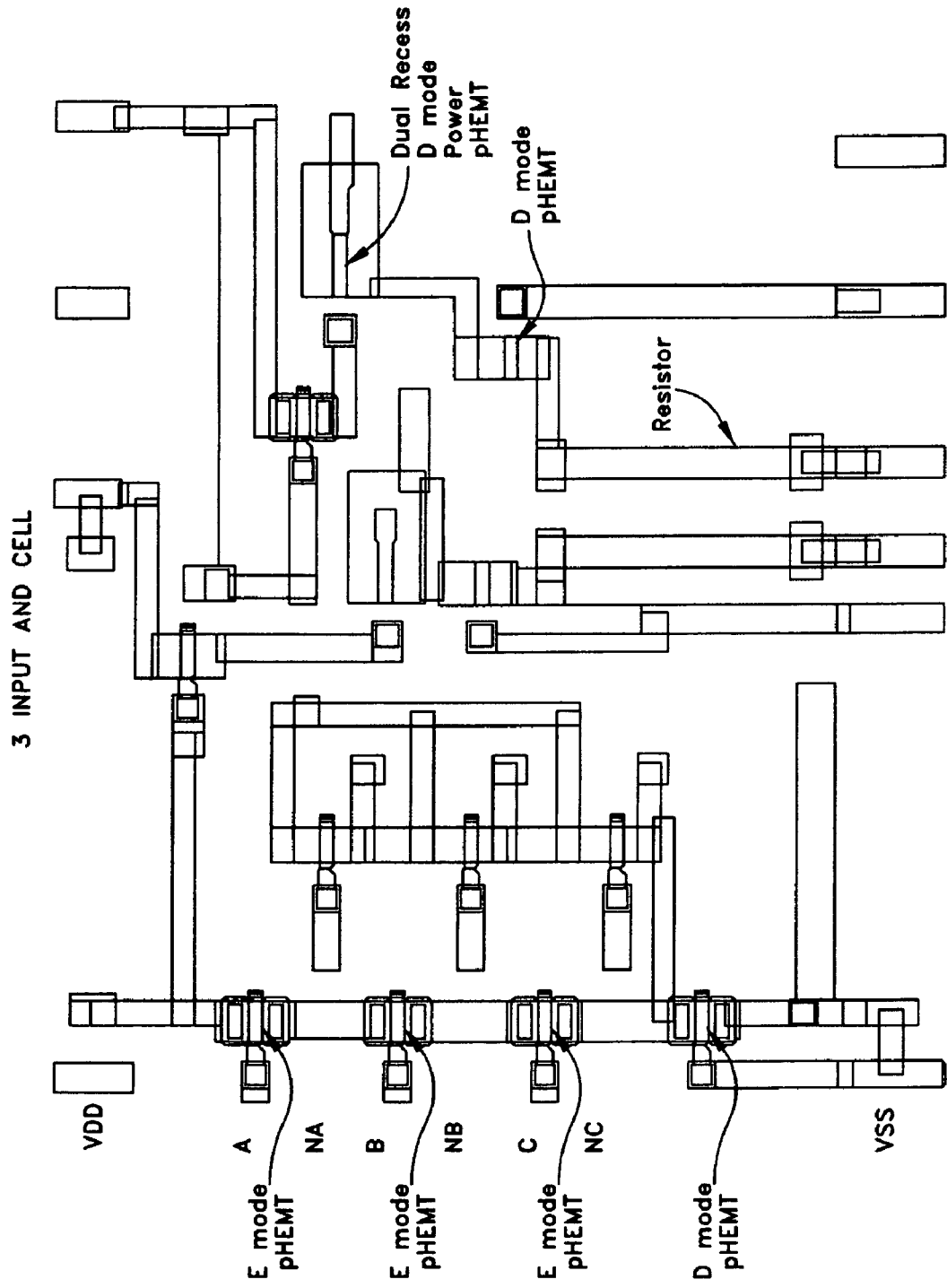
FIG. 5b is an exemplary 3 input "AND" cell of an exemplary pHEMT device.

FIG. 5a illustrates an exemplary gain stage of an exemplary pHEMT device 10. FIG. 5b illustrates an exemplary three input AND cell of an exemplary pHEMT device 10.

Figure 6:
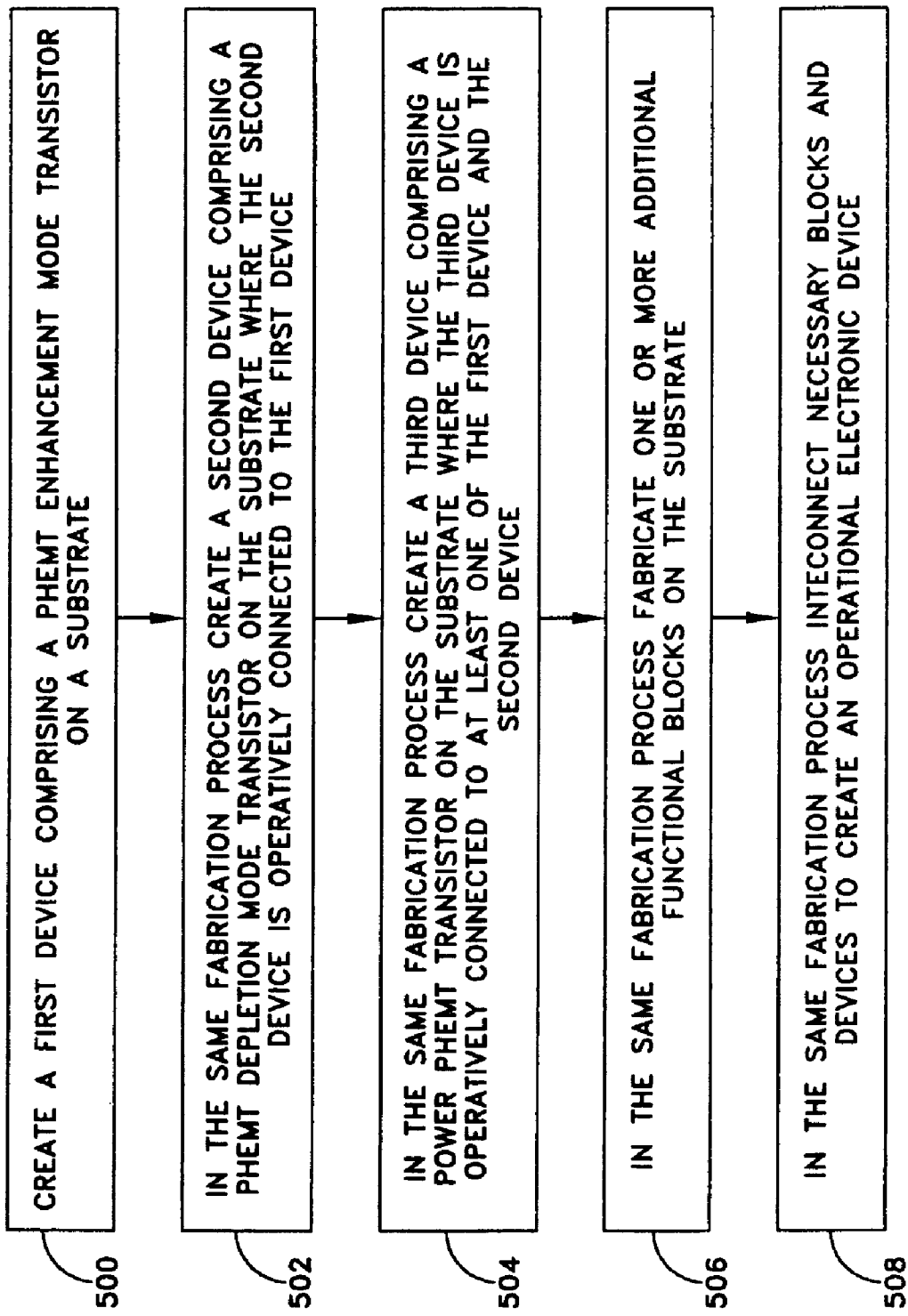
FIG. 6 is a flowchart of an exemplary method of fabricating an operational integrated circuit according to the present invention.

In the operation of an exemplary embodiment, referring now to FIG. 6 and. FIG. 2, in a preferred embodiment, electronic device 10 (FIG. 2) may be created in a single fabrication process to form one or more functional blocks 100,200, 300,400 (FIG. 2) where functional blocks 100,200,300,400 can be combined to create an operational device, e.g. device 10. An operational integrated circuit 10 may be fabricated according to the present invention in a single fabrication process by creating, at step 500, first block 200 comprising a pHEMT enhancement mode transistor 20 on substrate 50; using the same fabrication processing, creating, at step 502, second block 300 comprising a pHEMT depletion mode transistor 30 on substrate 50, where second block 300 is operatively connected to first block 200; and, using the same fabrication processing, creating, at step 504, third block 400 comprising a power pHEMT transistor 30 on substrate 50, third block 400 operatively connected to at least one of first block 200 and second block 300. Additional functional blocks 100 may be fabricated in the same fabrication process. The order in which blocks 100,200,300,400 are created is not material.

In a currently preferred embodiment, logic circuitry design utilizes a four μm spacing for all interconnects. For depletion mode pHEMT 30, a single recess is preferred where $V_p$=one tenth of a volt (0.1v). For enhancement mode pHEMT 20, a single recess is also preferred where $V_p$=a negative one volt (−1v). For power pHEMT 30, a double recess is preferred where $V_p$=a negative one volt (−1v).

Referring now to FIG. 6 and FIG. 1, in a preferred embodiment a triple etch-stop process is employed in fabricating device 10 (FIG. 1), e.g. to create wide recess, e-mode, and d-mode gates. An ohmic layer may be created, 600, on substrate 50 (FIG. 1) and devices 20,30,40 (FIG. 1) isolated, at step 602. A typical recess is illustrated at 40 in FIG. 1, and a wide recess, 604, illustrated at 20 in FIG. 1. Thickness of layers, e.g. 60,61,62 (FIG. 1) may be fine tuned to meet pinch-off voltage specifications.

A first T-gate, as that term is understood by those of ordinary skill in the art, may then be fabricated, step 606, typically for all devices to be fabricated according to the present invention. Gate recess and metal may be fabricated, 608. Optionally, a second T-gate pass, 610, and gate recess and metal, 612, may be fabricated.

Additional elements consisting of resistors, capacitors and inductors may be included in all blocks. Additional layers may be fabricated on substrate 50, step 614, and various additional devices fabricated, e.g. resistors at step 616. These additional layers may be created on substrate 50 to form resistors, capacitors, and inductors, e.g. steps 616-622. Referring still to FIG. 6, resistor, capacitor and inductor contacts may be formed, at step 618. A nitride layer may be formed, step 620, to form a capacitor dielectric as well as an inductor spacer. A top contact may be formed, at step 622 Metal 1. Resistors may be formed, e.g. at step 616.

An MIM top metal layer may be created, 626 followed by an air bridge metal layer, 628, and a protective overcoat, 630. Various finishing operations may then be accomplished, e.g. steps 634-642.

Using the present inventions method of fabrication, one watt power amplifiers, small signal monolithic microwave and millimeter wave integrated circuits (MMICs), and control circuits may be integrated on a single substrate such as substrate 50 (FIG. 1). One such device 10 may be an analog to digital converter (A/DC) capable of operating a X-band frequencies, e.g. up to 10 GHz. However, as will be appreciated by those in the art, functional blocks 100,200,300,400 may be combined in numerous ways to form numerous circuits, e.g. devices 10 combining digital, radio frequency (RF), and power functional blocks 100,200,300,400 on common substrate 50. Moreover, A/DC devices 10 could be integrated into an even higher function device 10, e.g. one that may be used to replace heterodyne receiver technology and have complete integration of RF to Receiver I and Q data on one chip, e.g. a receiver on a chip.

It will be understood that various changes in the details, materials, and arrangements of the parts which have been described and illustrated above in order to explain the nature of this invention may be made by those skilled in the art without departing from the principle and scope of the invention as recited in the following claims.

I claim:

1. A method of creating an operational integrated circuit, comprising:
   a. creating a first block comprising a pHEMT enhancement mode transistor on a substrate;
   b. creating a second block comprising a pHEMT depletion mode transistor on the substrate, the second block operatively connected to the first block; and
   c. creating a third block comprising a power pHEMT transistor on the substrate, the third block operatively connected to at least one of the first block and the second block.

2. A method according to claim 1 wherein the operational integrated circuit is created in a single fabrication process.

3. An integrated circuit, comprising:
   a. a first block comprising an enhancement mode pHEMT transistor on a substrate;
   b. a second block comprising a depletion mode pHEMT transistor on the substrate, the second block operatively connected to the first block; and
   c. a third block comprising a power pHEMT transistor on the substrate, the third block operatively connected to at least one of the first block and the second block.

4. An integrated circuit according to claim 3 further comprising:
   a. an analog input for electrical signals in communication with at least one of the first block, the second block, and the third block;
   b. a clock input in communication with at least one of the first block, the second block, and the third block; and
   c. a digital output for electrical signals in communication with at least one of the first block, the second block, and the third block;
   d. wherein the first block, the second block, and the third block connect to form an analog to digital converter.

5. An integrated circuit according to claim 3 wherein the integrated circuit is a microwave and millimeter wave integrated circuit (MMIC).

6. An integrated circuit according to claim 3 wherein the circuit is capable of operating at a frequency within the range of from very low frequency up to and including X-band frequencies.

7. An analog to digital converter, comprising an enhancement mode pHEMT device, a depletion mode pHEMT device, and a power pHEMT device on a single substrate.

8. An analog to digital converter according to claim 7, wherein the substrate comprises a group III-V material.

9. An analog to digital converter according to claim 8, wherein the substrate comprises gallium arsenide.

10. A plurality of integrated circuits on a single substrate, the plurality of integrated circuits adapted to be interconnected to form a functional block, at least one of the plurality of integrated circuits comprising:
   a. a first block, comprising an enhancement mode pHEMT transistor on a substrate;
   b. a second block, comprising a depletion mode pHEMT transistor on the substrate, the second block operatively connected to the first block; and
   c. a third block, comprising a power pHEMT transistor on the substrate, the third block operatively connected to at least one of the first block and the second block.

11. A plurality of integrated circuits on a single substrate according to claim 10 wherein the plurality of integrated circuits can be interconnected to form a plurality of functional blocks which can be interconnected to create an operational electronic device.

12. An integrated circuit according to claim 3, wherein each of said pHEMT transistors comprises a recess defined in said substrate and a gate formed in said recess.

13. An integrated circuit according to claim 12, wherein the recess of the depletion mode pHEMT transistor is a single recess.

14. An integrated circuit according to claim 12, wherein the recess of the power pHEMT transistor is a double recess.

15. An integrated circuit according to claim 12, wherein the recess of the enhancement mode pHEMT transistor is a single recess.

16. An integrated circuit according to claim 15, wherein the recess of the power pHEMT transistor is a double recess, the recess of the depletion mode pHEMT transistor is a single recess, and each of said recesses is defined through at least one common layer of said substrate.

17. An integrated circuit according to claim 12, wherein at least one of said gates is a T-gate.

18. An integrated circuit according to claim 3, wherein a pinch off voltage of the depletion-mode pHEMT transistor is about positive 0.1 volts.

19. An integrated circuit according to claim 3, wherein a pinch off voltage of the enhancement-mode pHEMT transistor is about negative 1.0 volts.

\* \* \* \* \*